US008991950B2

United States Patent
Privitera et al.

(10) Patent No.: US 8,991,950 B2
(45) Date of Patent: Mar. 31, 2015

(54) MODULAR ELECTRONICS CHASSIS

(71) Applicants: Peter Privitera, San Francisco, CA (US); Jon Carver, Millbrae, CA (US); Joshua Druker, Redwood City, CA (US); Tad Hunt, Sunnyvale, CA (US); Douglas Brockett, Menlo Park, CA (US); Ramesh Balan, Cupertino, CA (US)

(72) Inventors: Peter Privitera, San Francisco, CA (US); Jon Carver, Millbrae, CA (US); Joshua Druker, Redwood City, CA (US); Tad Hunt, Sunnyvale, CA (US); Douglas Brockett, Menlo Park, CA (US); Ramesh Balan, Cupertino, CA (US)

(73) Assignee: Exablox Corporation, Sunnyvale, CA (US)

( * ) Notice: Subject to any disclaimer, the term of this patent is extended or adjusted under 35 U.S.C. 154(b) by 43 days.

(21) Appl. No.: 13/939,027

(22) Filed: Jul. 10, 2013

(65) Prior Publication Data

US 2015/0015131 A1   Jan. 15, 2015

(51) Int. Cl.

| G06F 1/16 | (2006.01) |
|---|---|
| H05K 5/00 | (2006.01) |
| H05K 7/00 | (2006.01) |
| G06F 1/18 | (2006.01) |
| G11B 33/12 | (2006.01) |
| H05K 5/02 | (2006.01) |
| H05K 13/00 | (2006.01) |

(52) U.S. Cl.
CPC ............... *G06F 1/187* (2013.01); *G06F 1/183* (2013.01); *H05K 13/00* (2013.01); *G11B 33/124* (2013.01); *H05K 5/0295* (2013.01)
USPC .......................................................... 312/309

(58) Field of Classification Search
CPC ....... G06F 1/187; G06F 1/183; G11B 33/124; H05K 5/0295

USPC ............ 312/223.1, 223.2, 330.1, 332.1, 9.11, 312/9.14, 9.15, 9.25, 9.26, 9.27, 9.41, 9.42, 312/9.47, 9.48; 361/679.33–679.39; 720/646

See application file for complete search history.

(56) References Cited

U.S. PATENT DOCUMENTS

| 5,483,419 | A | * | 1/1996 | Kaczeus et al. | .......... | 361/679.39 |
|---|---|---|---|---|---|---|
| 5,597,316 | A | * | 1/1997 | David et al. | .................. | 439/159 |
| 6,210,188 | B1 | * | 4/2001 | Chang | ........................... | 439/159 |
| 6,270,174 | B1 | * | 8/2001 | Nishi | ......................... | 312/223.1 |
| 6,411,505 | B1 | * | 6/2002 | DiFonzo et al. | ......... | 361/679.38 |
| 6,587,350 | B1 | * | 7/2003 | Lin et al. | ....................... | 361/754 |
| 6,798,650 | B2 | * | 9/2004 | Reznikov et al. | ........ | 361/679.33 |
| 7,559,781 | B2 | * | 7/2009 | Yuh | .............................. | 439/159 |
| 7,559,782 | B2 | * | 7/2009 | Yuh | .............................. | 439/160 |
| 8,045,326 | B1 | * | 10/2011 | Reznikov | ................. | 361/679.38 |
| 8,077,467 | B2 | * | 12/2011 | Chen et al. | .................... | 361/726 |
| 8,355,256 | B2 | * | 1/2013 | Peng et al. | .................... | 361/725 |
| 8,369,080 | B2 | * | 2/2013 | Huang | ..................... | 361/679.38 |

(Continued)

*Primary Examiner* — Daniel J Troy
*Assistant Examiner* — Hiwot Tefera
(74) *Attorney, Agent, or Firm* — Carr & Ferrell LLP

(57) ABSTRACT

An apparatus for removing a modular electronic device from a chassis and a method for assembling thereof are provided. The apparatus for removing the modular electronic device from the chassis includes a door pivotally coupled to the chassis, a sliding element in slidable engagement with the door, an ejection actuator including a spring member connected to the ejection actuator and to the rear of the chassis, and a linkage element connecting the sliding element with the ejection actuator. Additionally, the apparatus for removing the modular electronic device from the chassis includes a guide rail disposed in the chassis enclosure to guide the modular electronic device and to guide the ejection actuator along the chassis enclosure.

20 Claims, 6 Drawing Sheets

(56) References Cited

U.S. PATENT DOCUMENTS

2005/0030721 A1* 2/2005 Shimada et al. ............. 361/726
2011/0299237 A1* 12/2011 Liang ...................... 361/679.38
2012/0218705 A1* 8/2012 Huang ..................... 361/679.37
2014/0345105 A1* 11/2014 Brockett, Douglas .......... 29/428

* cited by examiner

MODULAR ELECTRONICS CHASSIS

TECHNICAL FIELD

This disclosure relates generally to structures for mounting assemblies in a chassis of electronic equipment, and more specifically to an apparatus for removing a modular electronic device from a chassis and a method for assembling thereof.

DESCRIPTION OF RELATED ART

The approaches described in this section could be pursued but are not necessarily approaches that have been previously conceived or pursued. Therefore, unless otherwise indicated, it should not be assumed that any of the approaches described in this section qualify as prior art merely by virtue of their inclusion in this section.

Electronic equipment, such as processors, routers, switches, various peripheral devices, storage devices and the like may be assembled in a modular manner. This approach may enable a manufacturer to assemble electronic equipment using various combinations of pre-assembled modules. Additionally, a user of the equipment assembled in a modular manner may be able to easily replace or re-assemble the modules of the equipment. Examples of the pre-assembled modular electronics include data storage devices, printed circuit boards, audio/video electronic appliances such as a car radio, and any other removably mounted electronic devices.

In particular, data storage devices are widely used for storing information both for personal and business purposes. The data storage devices may be of temporary use, for example, when connected to electronic equipment for playing a movie, copying a file to or from a media device, reviewing photos; and long term use, for example, for storage expansion and functional enhancement. Typically, data storage devices require use of a carrier attached with screws to electronic equipment to provide for alignment within an equipment enclosure and to serve as a bearing surface for insertion or removal of the data storage device. This method of mounting modular electronic devices may be complex and time consuming. In addition to that, vibrations caused by operation of the modular electronic device may lead to loosening of screws and, as a result, to damage of the modular electronic device.

Existing carrierless solutions mostly attempt to solve problems of alignment of a modular electronic device in a chassis; however, issues of decoupling the modular electronic device from a connector of the electronic device, as well as issues of ejection forces applied to the modular electronic device, are not addressed.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

According to various embodiments and principles described herein, the problems of prior art are addressed by an apparatus for removing a modular electronic device from a chassis and a method for assembling the apparatus.

In accordance with one aspect, an apparatus for removing a modular electronic device from a chassis is provided. The apparatus may comprise a door pivotally coupled to the chassis in front of a chassis enclosure configured to enclose the modular electronic device. The apparatus may further comprise a sliding element in slidable engagement with the door and configured to move along the door. An ejection actuator of the apparatus may be disposed in a rear of the chassis enclosure. The ejection actuator may include a spring member. The spring member may be connected to the ejection actuator and to the rear of the chassis. The apparatus may further comprise a linkage element. The linkage element may be connected to the sliding element and to the ejection actuator and may pass through a point of pivotal coupling of the door to the chassis. The apparatus may additionally comprise at least one guide rail disposed in the chassis enclosure to guide the modular electronic device. The guide rail may extend from about an opening of the chassis enclosure to the rear of the chassis enclosure.

In accordance with another aspect, a method for assembling an apparatus for removing a modular electronic device from a chassis is provided. According to the method, a sliding element may be slidably engaged with a door. The door may be pivotally coupled to the chassis in front of a chassis enclosure. The method may further comprise disposing an ejection actuator in a rear of the chassis enclosure and connecting a spring member to the ejection actuator and to the rear of the chassis. Then, the sliding element and the ejection actuator may be connected by means of a linkage element. The linkage element may then be laid through a point of pivotal coupling of the door to the chassis. In some embodiments, the method may comprise disposing at least one guide rail in the chassis enclosure to guide the modular electronic device.

To the accomplishment of the foregoing and related ends, the one or more aspects comprise the features hereinafter fully described and particularly pointed out in the claims. The following description and the drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

Embodiments are illustrated by way of example and not limitation in the figures of the accompanying drawings, in which like references indicate similar elements and in which.

DETAILED DESCRIPTION

The following detailed description includes references to the accompanying drawings, which form a part of the detailed description. The drawings show illustrations in accordance with exemplary embodiments. These exemplary embodiments, which are also referred to herein as "examples," are described in enough detail to enable those skilled in the art to practice the present subject matter. The embodiments can be combined, other embodiments can be utilized, or structural, logical and electrical changes can be made without departing from the scope of what is claimed. The following detailed description is, therefore, not to be taken in a limiting sense, and the scope is defined by the appended claims and their equivalents.

The approaches and principles disclosed herein relate to an apparatus for removing a modular electronic device from a chassis and a method for assembling the apparatus for removing a modular electronic device from a chassis. Electronic equipment may be provided with a chassis defining a chassis enclosure formed with parallel sides and configured so as to provide guides for a modular electronic device or other devices removable from the chassis. The chassis may contain a plurality of modular electronic devices. The number and size of the modular electronic devices, as well as distance between adjacent modular electronic devices, may vary. The chassis may comprise an opening for insertion of the modular electronic device. Furthermore, the chassis may comprise at least one connector in a rear of the chassis enclosure to couple the modular electronic device with the chassis for applying power to the modular electronic device, exchanging data with the modular electronic device, and so forth. The connector may be configured to couple with the modular electronic device.

The insertion of the modular electronic device into the chassis may consist in positioning the modular electronic device in front of an opening for a modular electronic device and pushing the modular electronic device along the chassis until the modular electronic device couples with a connector in a rear of the chassis. The removal of the modular electronic device from the chassis may include two steps: firstly, decoupling the modular electronic device from the connector in the rear of the chassis and, secondly, ejecting the modular electronic device from the chassis.

Figure 1:
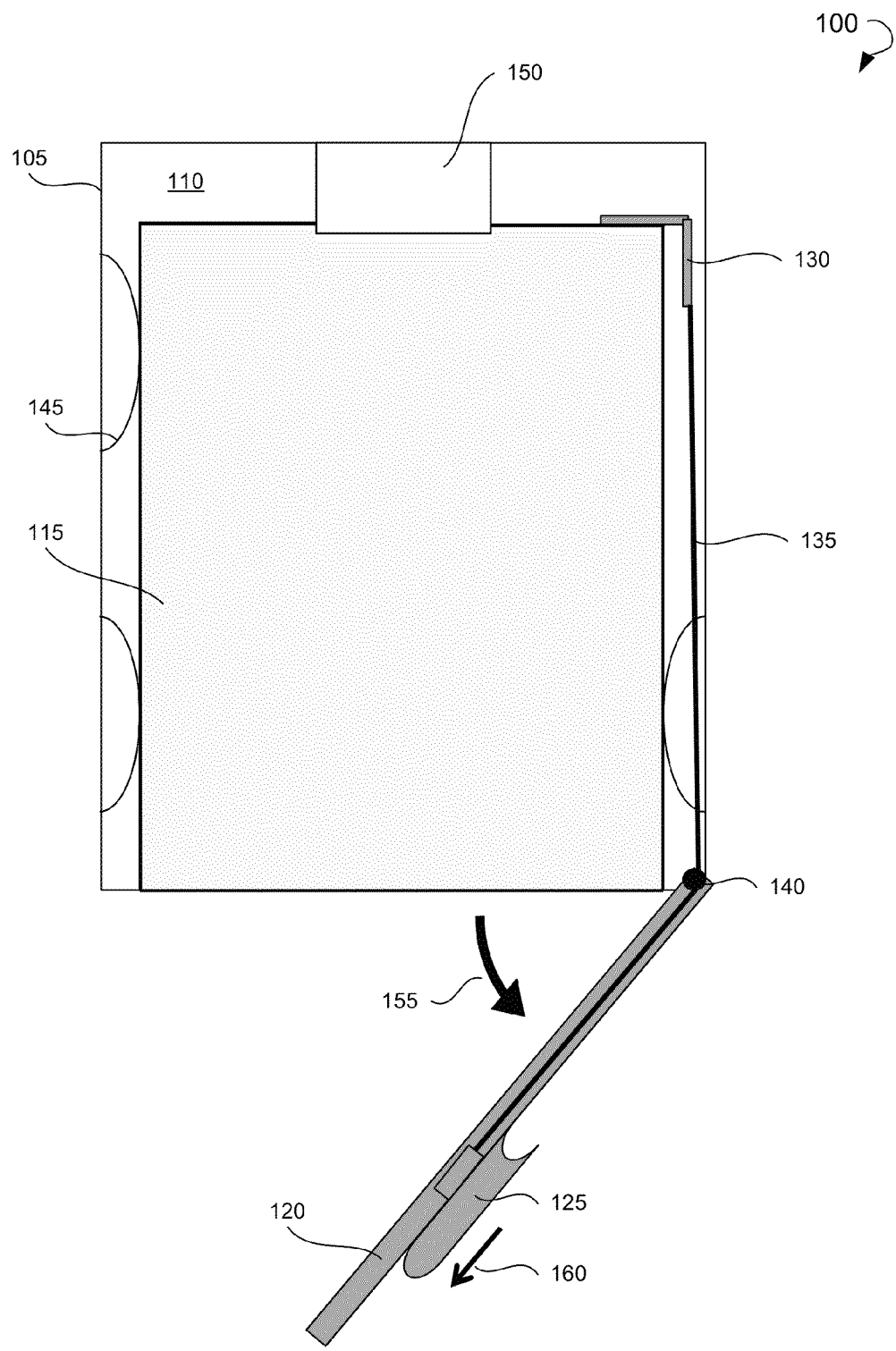
FIG. 1 shows a diagram of an apparatus for removing a modular electronic device from a chassis, in accordance to some example embodiments.

An example apparatus for removing a modular electronic device from a chassis may be illustrated with reference to FIG. 1. FIG. 1 is a diagram of an apparatus 100 for removing a modular electronic device from a chassis, in accordance to some example embodiments. A chassis 105 defines a chassis enclosure 110 configured to enclose a modular electronic device 115. The modular electronic device 115 is subject to considerable variation and may include one or more of a hard disk drive (HDD), a solid state disk (SSD), a disk array, a compact disk, a flash memory module, and like devices capable of storing data. The apparatus 100 may comprise a door 120 pivotally coupled to the chassis 105 in front of the chassis enclosure 110. The door 120 may act as a mechanical attachment point and a guide for a sliding element 125 configured to slidably engage the door 120 and to move in one dimension along the door 120. An arrow 160 shows one of possible directions of moving the sliding element 125 along the door 120. The sliding element 125 may be coupled to an ejection actuator 130 disposed in a rear of the chassis enclosure 110. The sliding element 125 and the ejection actuator 130 may be coupled to each other, either rigidly or flexibly, by means of a linkage element 135. The linkage element 135 may have a first linkage element end and a second linkage element end, and may be connected, by the first linkage element end, to the sliding element 125. Linkage element 135 may be connected to the ejection actuator 130 by the second linkage element end. In various embodiments, the linkage element 135 may be rigid or flexible. The rigid linkage element 135 may be configured as a single element or a multilink element. The flexible linkage element 135 may include a fiber, a string, a fishing line, a wire, and the like. The linkage element 135 may pass through a point 140 of pivotal coupling of the door 120 to the chassis 105. A length of the door 120 may be variable to regulate a force of ejection of the modular electronic device 115.

The apparatus 100 may optionally comprise at least one guide rail 145 to guide the modular electronic device 115. The guide rail 145 may extend from about an opening of the chassis enclosure 110 to the rear of the chassis enclosure 110. The ejection actuator 130 may be configured to move along the chassis enclosure 110 and optionally along the guide rail 145. In a preferred embodiment, the ejection actuator 130 may have an angled construction, and in particular, it may be configured as an angle bracket. Due to the angled construction, the ejection actuator 130 may push the modular electronic device 115 while moving along the chassis enclosure 110 in a direction from the rear of the chassis enclosure 110 towards an opening for insertion of the modular electronic device 115. Pushing the modular electronic device 115 will result in decoupling the modular electronic device 115 from a connector 150 in the rear of the chassis enclosure 110 that couples the modular electronic device 115 with the chassis 105. Furthermore, pushing the modular electronic device 115 will result in moving the modular electronic device 115 along the chassis enclosure 110 in a direction towards the opening and, finally, in removing the modular electronic device 115 from the chassis 105.

The door 120 may be configured to rotate around the point 140 between a closed position and an open position. An arrow 155 shows one of possible directions of rotation of the door 120. The closed position and the open position of the door 120 are shown in detail with reference to FIGS. 2A and 2B.

Figure 2A:
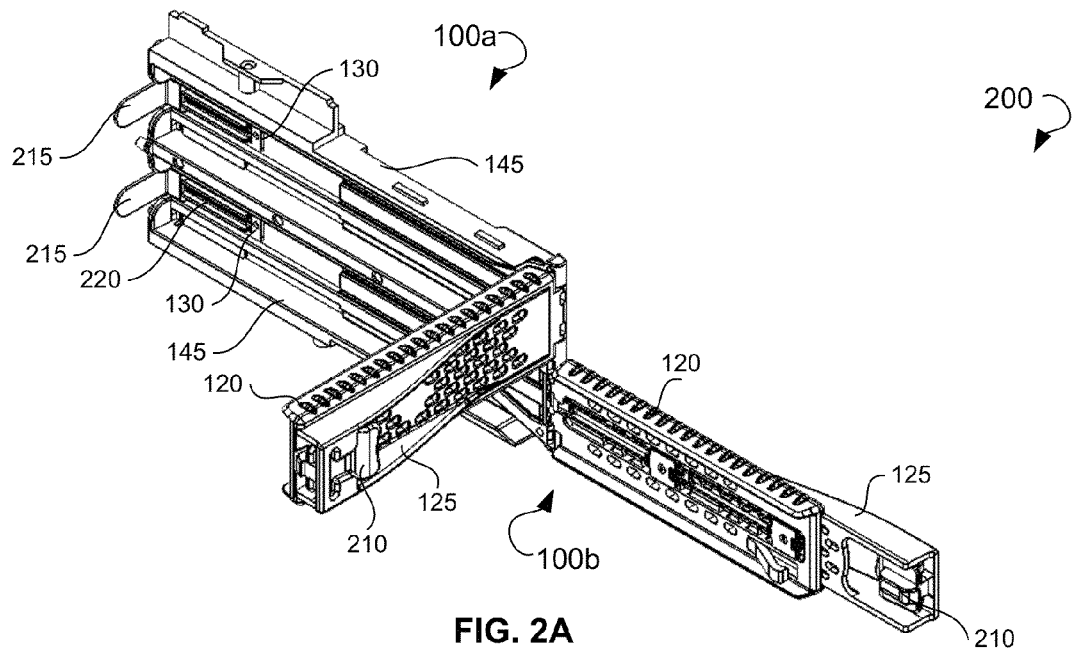
FIG. 2A shows a perspective view of an apparatus for removing a modular electronic device from a chassis, in accordance to some example embodiments.
Figure 2B:
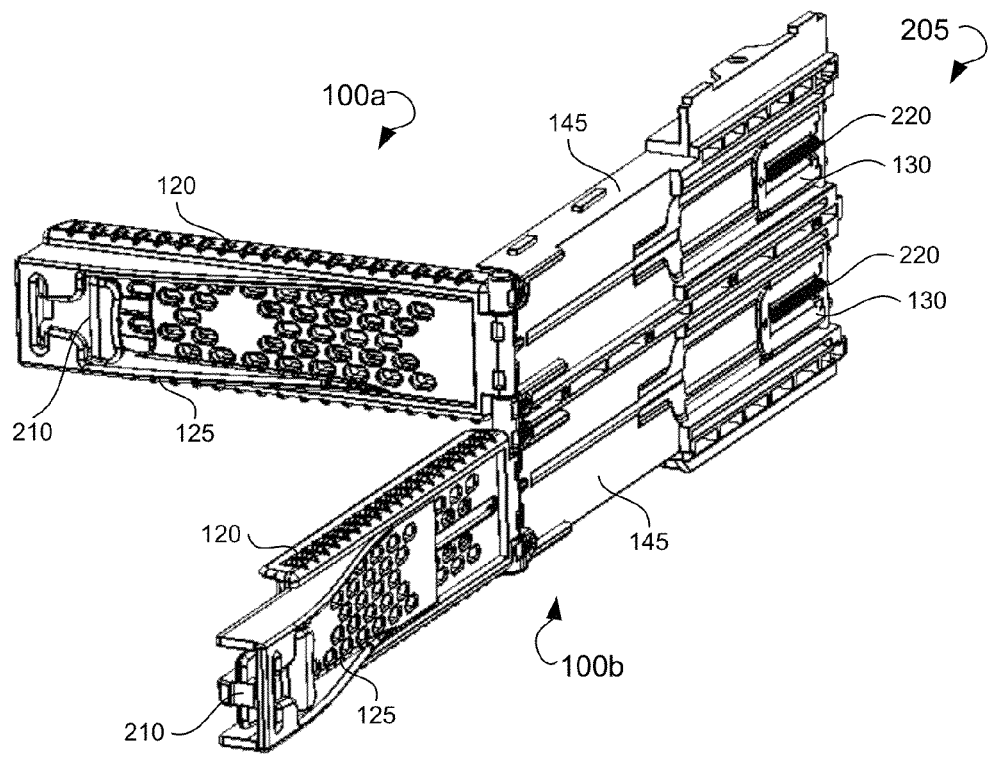
FIG. 2B shows a perspective view of an apparatus for removing a modular electronic device from a chassis, in accordance to some example embodiments.

FIGS. 2A and 2B show perspective views 200, 205 of the apparatus for removing a modular electronic device, in accordance to some example embodiments. FIGS. 2A and 2B show an example embodiment with two apparatuses 100a, 100b for removing a modular electronic device mounted on top of one another. The door 120 of the upper apparatus 100a on FIGS. 2A and 2B is shown in a closed position. In the closed position, the door 120 may cover the chassis enclosure to capture the modular electronic device mechanically and to prevent the modular electronic device from decoupling and being, for example, accidentally removed from the chassis. Furthermore, the door 120 in the closed position may prevent electromagnetic emissions from the chassis. The door 120 of the lower apparatus 100b on FIGS. 2A and 2B is shown in an open position. In this position, the door 120 may allow removal of the modular electronic device from the chassis. In some embodiments, the apparatuses 100a, 100b may be configured to accommodate dimensional variations of the modular electronic device. For this purpose, spring elements (not shown) may be mounted, for example, in the rear of the chassis or at any other side of the chassis, to push the modular electronic device against a connector (not shown) coupling the modular electronic device to the chassis.

Each of the apparatuses 100a, 100b may optionally include a locking member 210 configured to lock the door 120 in an engaged position with the chassis. The locking member 210 may include a latch or any other suitable type of lock known to those skilled in the art. The locking member 210 may prevent unauthorized removal of the modular electronic device from the chassis. Furthermore, the locking member 210 may be configured as a tamper evident seal to indicate whether the modular electronic device has been removed from the chassis or reinserted.

The sliding element 125 of the upper apparatus 100a on FIGS. 2A and 2B is shown in an initial position of the sliding element 125. In this position, the sliding element 125 does not extend from the door 120. In the lower apparatus 100b on FIGS. 2A and 2B, the sliding element 125 is shown extending from the door 120 (namely, pulled out of the door 120).

As FIGS. 2A and 2B show, the ejection actuator 130 may be configured as an angle bracket and may comprise a pusher 215 to push the modular electronic device. Furthermore, the ejection actuator 130 may comprise a spring member 220. The spring member 220 may have a first spring member end and a second spring member end. The spring member 220 may be connected to the ejection actuator 130 by the first spring member end and to the rear of the chassis by the second spring member end. In view of the connection of the spring member 220 with the chassis, the spring member 220 may be configured to restore the ejection actuator 130 to an initial position of the ejection actuator 130 in the chassis enclosure after the ejection actuator 130 has been moved along the chassis towards an opening for insertion of the modular electronic device.

In an example embodiment, the ejection actuator 130 may be mechanized with an electric motor (not shown). Additionally, the ejection actuator 130 may be electronically coupled to at least one sensing means (not shown) configured to alert a user to a complete or an incomplete insertion or a removal of the modular electronic device. The alert may be facilitated by one or more Light Emitting Diodes (LEDs) (not shown) associated with the chassis. Optionally, the alert may be facilitated by a sound generating unit (not shown) associated with the chassis.

Figure 3:
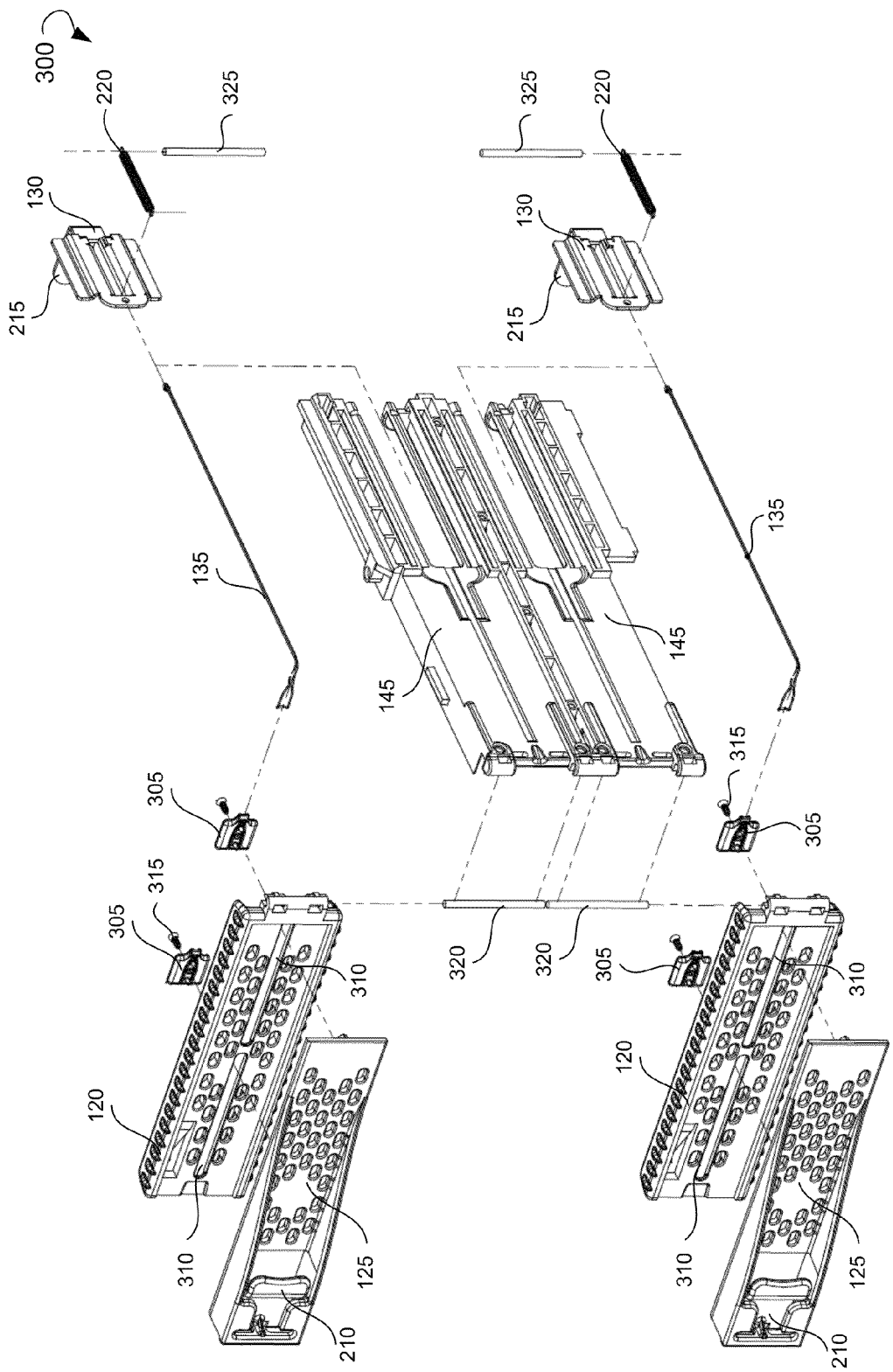
FIG. 3 is a diagrammatic representation of assembling an apparatus for removing a modular electronic device from a chassis, in accordance to some example embodiments.

FIG. 3 shows a diagrammatic representation 300 of assembling an apparatus for removing a modular electronic device from a chassis, in accordance to some example embodiments. An example embodiment of assembling two apparatuses for removing a modular electronic device mounted on top of one another is shown in FIG. 3. Assembling an apparatus for removing a modular electronic device from a chassis may start with slidably engaging a sliding element 125 with a door 120. The sliding element 125 may be coupled with the door 120 by means of at least one connecting member 305. For this purpose, the door 120 may have at least one opening 310. The connecting member 305 may be positioned in front of the opening 310 from the side of the door 120 free of the sliding element 125. At least one fastener 315 may go through the connecting member 305, pass through the opening 310, and enter into the sliding element 125, thus enabling the slidable movement of the sliding element 125 along the door 120. In certain embodiments, the sliding element 125 may be configured so as to be inserted directly into the door 120. Therefore, no connecting members may be needed for coupling the sliding element 125 with the door 120.

Assembling may further continue with pivotal coupling the door 120, being in slidable engagement with the sliding element 125, to the chassis (not shown) in front of a chassis enclosure (not shown). For this purpose, the pivotal coupling may be performed by means of at least one pivotal axis 320 installed at an opening (not shown) for insertion of a modular electronic device. The door 120 may be installed on the axis 320. Optionally, at least one guide rail 145 may be disposed in the chassis enclosure. The guide rail 145 may guide the modular electronic device in the chassis enclosure.

After coupling the door 120 to the chassis, an ejection actuator 130 may be disposed in a rear of the chassis enclosure (not shown). The ejection actuator 130 may be connected to a first end of a spring member 220, while the second end may be connected to an axis 325 installed in the rear of the chassis (not shown). In an example embodiment, the ejection actuator 130 may be configured to move along the guide rail 145.

Further, the sliding element 125 may be coupled with the ejection actuator 130 by means of a linkage element 135. For this purpose, a first linkage element end may be connected to the sliding element 125, and a second linkage element end may be connected to the ejection actuator 130. In certain embodiments, the linkage element 135 may be connected to the connecting member 305 connected to the sliding element 125. In further embodiments, the linkage element 135 may be connected to the sliding element 125 directly. The linkage element 135 may be laid so that the linkage element 135 passes through the axis 320 (i.e., through a point of pivotal coupling the door 120 to the chassis).

Figure 4:
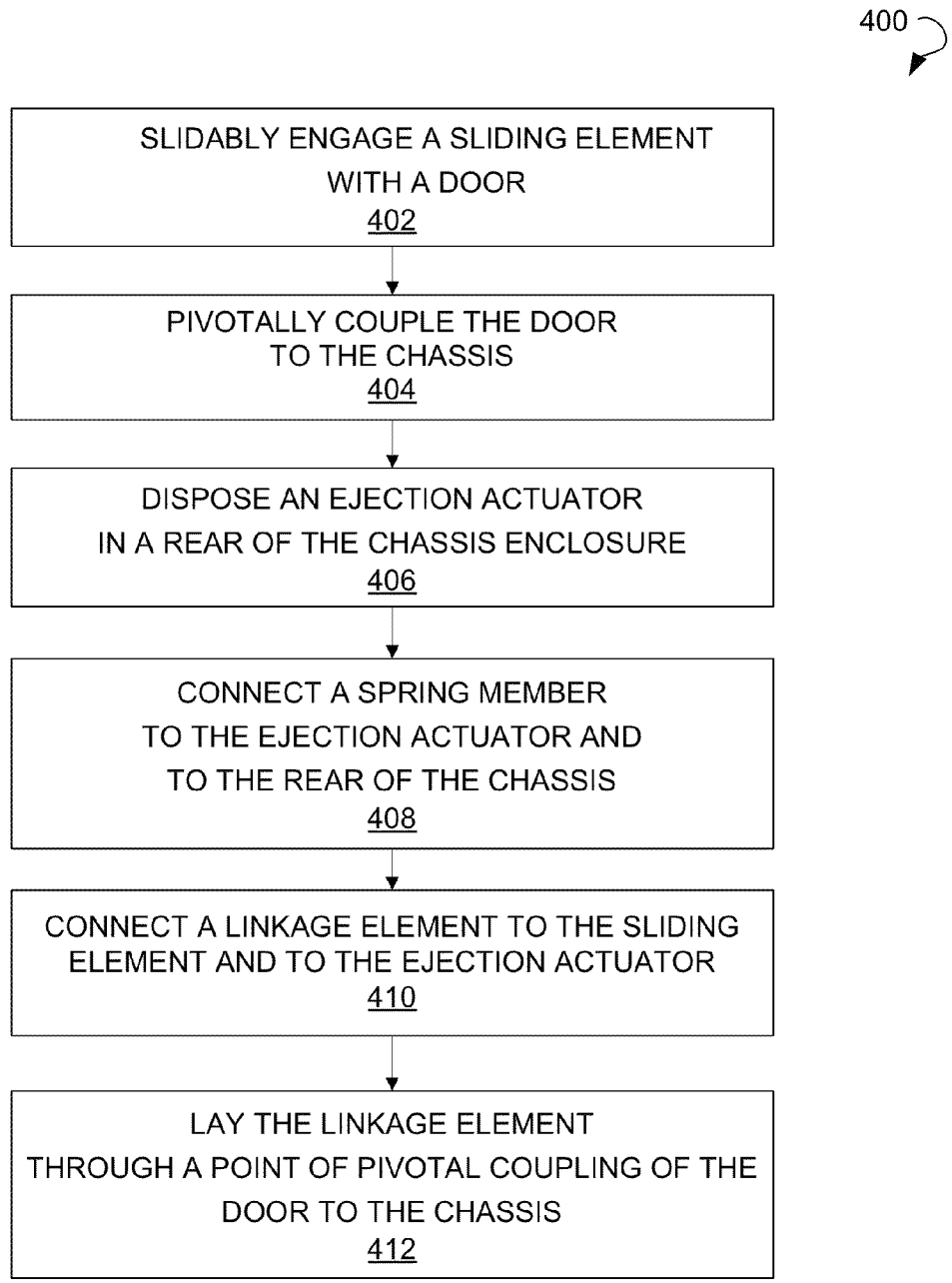
FIG. 4 is a flow chart illustrating a method for assembling an apparatus for removing a modular electronic device from a chassis, in accordance to some example embodiments.

FIG. 4 is a flow chart illustrating a method 400 for assembling an apparatus for removing a modular electronic device from a chassis, in accordance to some example embodiments. The method 400 may commence at operation 402 with slidably engaging a sliding element with a door. At operation 404, the door may be pivotally coupled to the chassis in front of a chassis enclosure. Method 400 may proceed with disposing an ejection actuator in a rear of the chassis enclosure at operation 406. The ejection actuator may be connected to a spring member having a first spring member end and a second spring member end, where the first spring member end may be connected to the ejection actuator, and the second spring member end may be connected to the rear of the chassis at operation 408. At operation 410, a linkage element having a first linkage element end and second linkage element end may be connected, by the first linkage element end, to the sliding element and, by the second linkage element end, to the ejection actuator. The linkage element may be laid through a point of pivotal coupling of the door to the chassis at operation 412. In certain optional operations, a length of the door may be variable to regulate a force of ejection of the modular electronic device.

The method 400 may optionally proceed with disposing at least one guide rail in the chassis enclosure to guide the modular electronic device. In optional operations, the ejection actuator may be electronically coupled to at least one sensing means configured to alert a user to a complete or an incomplete insertion or a removal of the modular electronic device. In further optional operations, the ejection actuator may be mechanized with an electric motor.

Figure 5A:
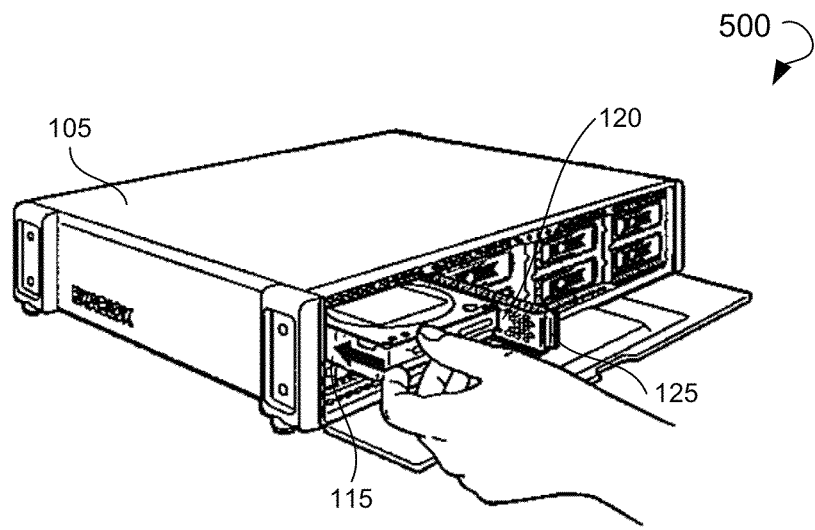
FIG. 5A shows a diagrammatic representation of insertion of a modular electronic device into a chassis, in accordance to some example embodiments.

FIG. 5A shows a diagrammatic representation 500 of an insertion of a modular electronic device 115 into a chassis 105, in accordance to some example embodiments. To insert the modular electronic device 115 into a chassis 105, a door 120 of an apparatus for removing a modular electronic device may be opened, and the modular electronic device 115 may be inserted into an opening of the chassis 105. The modular electronic device 115 may be pushed in a direction towards a rear of the chassis 105 until the modular electronic device 115 is inserted completely into the chassis 105. After the modular electronic device 115 is inserted, the door 120 may be rotated around a point of pivotal coupling of the door 120 to the chassis 105 from an open position shown on FIG. 5A, when the door 120 may allow insertion or removal of the modular electronic device 115, to a closed position when the door 120 may cover the chassis enclosure to prevent the modular electronic device 115 from being removed from the chassis 105. In an example embodiment, a locking member (not shown) may be locked to lock the door 120 in an engaged position with the chassis 105.

Figure 5B:
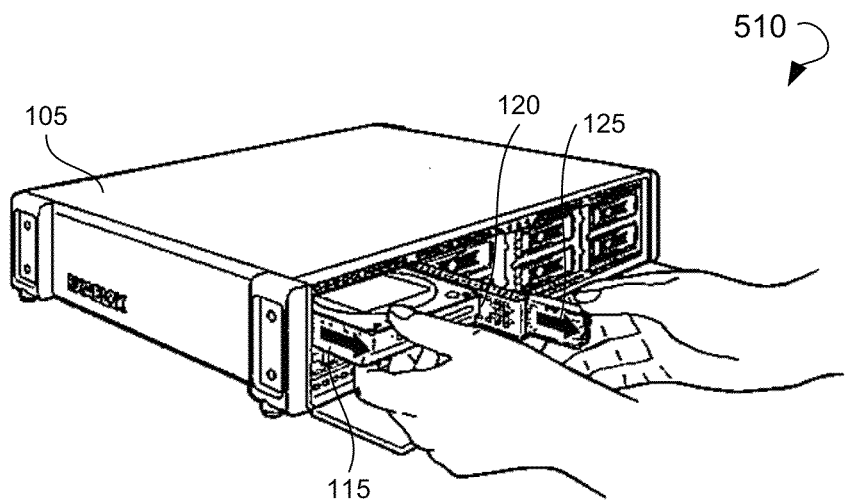
FIG. 5B shows a diagrammatic representation of removal of a modular electronic device from a chassis, in accordance to some example embodiments.

FIG. 5B shows a diagrammatic representation 510 of a removal of a modular electronic device 115 from a chassis 105, in accordance to some example embodiments. In an example embodiment, to remove the modular electronic device 115 from a chassis 105, a locking member (not shown) may be unlocked to unlock the door 120 from an engaged position with the chassis 105. Then the door 120 may be rotated around a point of pivotal coupling of the door 120 to the chassis 105 from a closed position to an open position, when the door 120 may allow removal of the modular electronic device 115 from the chassis 105. On FIG. 5B the door 120 is shown in the open position. After that, the sliding element 125 may be pulled in a direction along the door 120 away from the chassis enclosure. Movement of the sliding element 125, coupled with an ejection actuator (not shown) via a linkage element (not shown), may cause movement of the ejection actuator. While moving, the ejection actuator may push the modular electronic device 115 in the chassis enclosure in a direction towards the opening for insertion of the modular electronic device 115. Pushing the modular electronic device 115 may result in decoupling the modular electronic device 115 from a connector (not shown) in a rear of the chassis enclosure coupling the modular electronic device 115 with the chassis 105, and moving the modular electronic device 115 along the chassis enclosure in the direction towards the opening for insertion of the modular electronic device 115. When the modular electronic device 115 extends out from the chassis 105 for a length enough to take the modular electronic device 115, the modular electronic device 115 may be taken and removed from the chassis 105. After the ejection of the modular electronic device 115, the sliding element 125 may be released. After releasing the sliding element 125, in view of connection of the ejection actuator to a spring member (not shown) connected by one end of the spring member to the rear of the chassis 105, the spring member may enable restoration of the ejection actuator to an initial position in the chassis enclosure.

Figure 6:
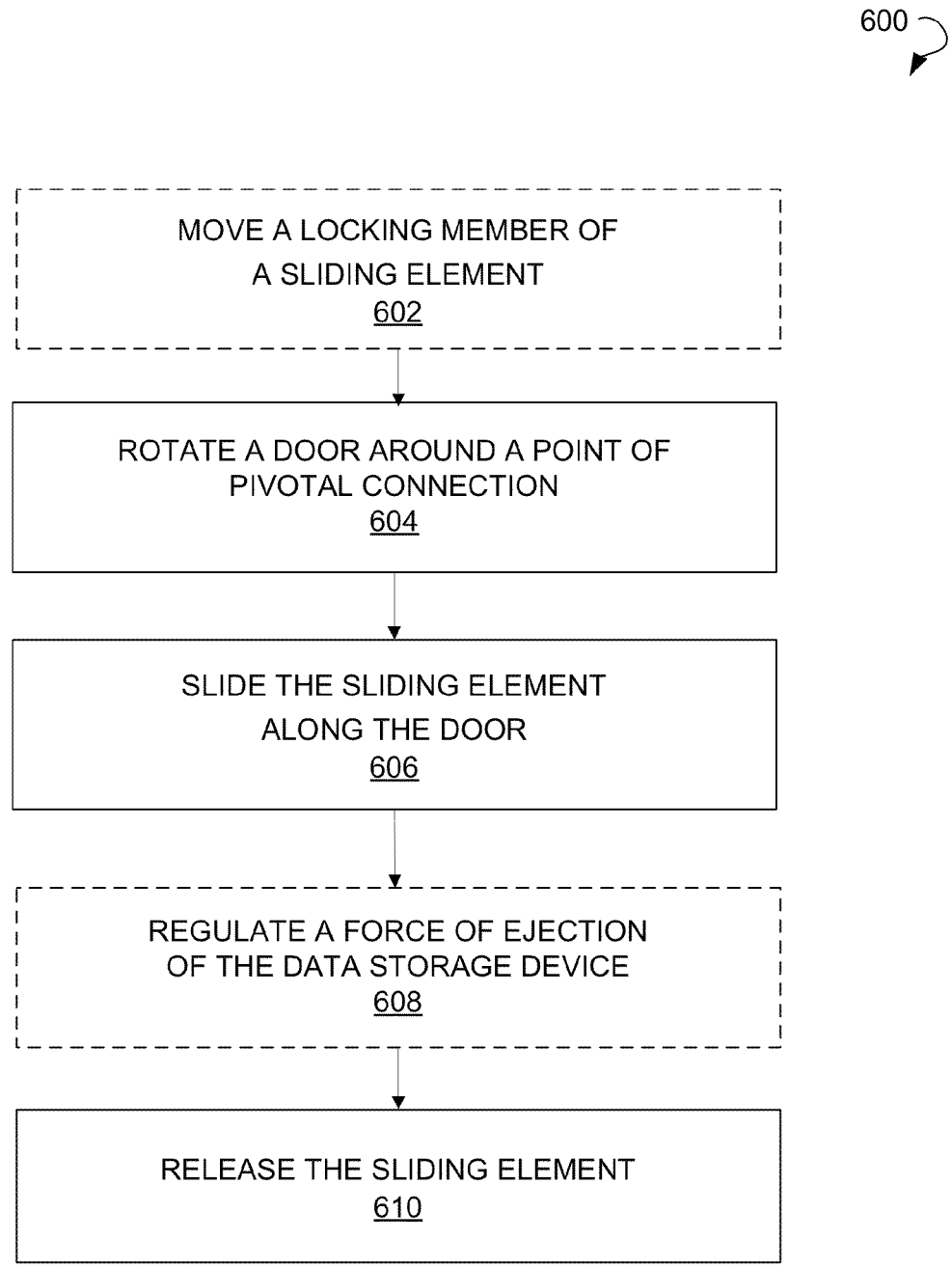
FIG. 6 is a flow chart illustrating a method for using an apparatus for removing a modular electronic device from a chassis, in accordance to some example embodiments.

FIG. 6 is a flow chart illustrating a method 600 for using an apparatus for removing a modular electronic device from a chassis, in accordance to some example embodiments. The method 600 may optionally commence with moving a locking member in slidable engagement with a door to unlock the door from an engaged position with the chassis at operation 602. At operation 604, the door may be rotated around a point of pivotal coupling of the door to the chassis to an open position, when the door allows removal of the modular electronic device from the chassis. The method 600 may proceed with operation 606 of sliding the sliding element along the door in a direction away from the chassis enclosure (i.e., pulling the sliding element in a direction towards a person who is removing the modular electronic device). At operation 608, a force of ejection of the modular electronic device may be optionally regulated by regulating a force of pulling the sliding element along the door. The higher the force of pulling the sliding element, the higher the force of ejection of the modular electronic device from the chassis. Pulling the sliding element, coupled with an ejection actuator by means of a linkage element, may cause movement of the ejection actuator along the chassis in a direction towards the opening for insertion of the modular electronic device. The ejection actuator, while moving, may push the modular electronic device in a direction of movement of the ejection actuator resulting in decoupling the modular electronic device from the chassis and ejection of the modular electronic device from the chassis. At operation 610, the sliding element may be released. Releasing the sliding element may result in restoring the ejection actuator to an initial position of the ejection actuator in the chassis enclosure by means of a spring member connected to the ejection actuator and the rear of the chassis.

Thus, an apparatus for removing a modular electronic device from a chassis and a method for assembling an apparatus for removing a modular electronic device from a chassis are described. Although embodiments have been described with reference to specific exemplary embodiments, it will be evident that various modifications and changes can be made to these exemplary embodiments without departing from the broader spirit and scope of the present application. Accordingly, the specification and drawings are to be regarded in an illustrative rather than a restrictive sense.

What is claimed is:

1. An apparatus for removing a modular electronic device from a chassis, comprising:
   a door pivotally coupled to the chassis in front of a chassis enclosure and along an axis pivotal coupling, the axis of pivotal coupling extending through the door, the chassis enclosure configured to enclose the modular electronic device;
   a sliding element in slidable engagement with the door, the sliding element configured to move along the door;
   an ejection actuator disposed in a rear of the chassis enclosure, the ejection actuator including a spring member, wherein the spring member has a first spring member end and a second spring member end, the first spring member end being connected to the ejection actuator, and the second spring member end being connected to the rear of the chassis; and
   a flexible linkage element having a first linkage element end and a second linkage element end, the flexible linkage element being connected, by the first linkage element end, to the sliding element and connected, by the second linkage element end, to the ejection actuator, wherein the flexible linkage element passes around the axis of pivotal coupling of the door to the chassis.

2. The apparatus of claim 1, wherein the door is configured to rotate between a closed position and an open position, wherein in the closed position the door covers the chassis enclosure to prevent the modular electronic device from being removed from the chassis, and wherein in the open position the door allows removal of the modular electronic device from the chassis.

3. The apparatus of claim 1, wherein the ejection actuator is configured to move along the chassis enclosure and remove the modular electronic device from the chassis.

4. The apparatus of claim 1, further comprising at least one guide rail disposed in the chassis enclosure to guide the modular electronic device, the at least one guide rail extending from about an opening of the chassis enclosure to the rear of the chassis enclosure.

5. The apparatus of claim 4, wherein the ejection actuator is configured to move along the guide rail.

6. The apparatus of claim 1, wherein the spring member is configured to restore the ejection actuator to an initial position in the chassis enclosure.

7. The apparatus of claim 1, wherein the ejection actuator includes an angle bracket.

8. The apparatus of claim 1, wherein a length of the door is variable to regulate a force of ejection of the modular electronic device.

9. The apparatus of claim 1, wherein the ejection actuator is mechanized with an electric motor.

10. The apparatus of claim 1, wherein the ejection actuator is electronically coupled to at least one sensor configured to alert a user to a complete or an incomplete insertion or a removal of the modular electronic device.

11. The apparatus of claim 10, wherein the alert is facilitated by one or more Light Emitting Diodes (LEDs) associated with the chassis.

12. The apparatus of claim 1, wherein the sliding element includes a locking member configured to lock the door in an engaged position with the chassis.

13. The apparatus of claim 12, wherein the locking member includes a latch.

14. The apparatus of claim 13, wherein the modular electronic device includes a hard disk drive (HDD), a solid state disk (SSD), a disk array, a compact disk, and a flash memory module.

15. A method for assembling an apparatus for removing a modular electronic device from a chassis, comprising:
   slidably engaging a sliding element with a door;
   pivotally coupling the door to the chassis in front of a chassis enclosure, and analog an axis of pivotal coupling, the axis of pivotal coupling extending through the door, wherein the chassis enclosure is configured to enclose the modular electronic device;
   disposing an ejection actuator in a rear of the chassis enclosure;
   connecting a spring member having a first spring member end and a second spring member end, by the first spring member end, to the ejection actuator and, by the second spring member end, to the rear of the chassis;
   connecting a flexible linkage element having a first linkage element end and a second linkage element end, by the first linkage element end, to the sliding element and, by the second linkage element end, to the ejection actuator; and
   laying the flexible linkage element around the axis of pivotal coupling of the door to the chassis.

16. The method of claim 15, further comprising disposing at least one guide rail in the chassis enclosure to guide the modular electronic device.

17. The method of claim 15, further comprising varying a length of the door to regulate a force of ejection of the modular electronic device.

18. The method of claim 15, further comprising electronically coupling the ejection actuator to at least one sensor configured to alert a user to a complete or an incomplete insertion or a removal of the modular electronic device.

19. The method of claim 15, further comprising mechanizing the ejection actuator with an electric motor.

20. An apparatus for removing a modular electronic device from a chassis, comprising:
   a door pivotally coupled to the chassis in front of a chassis enclosure and along an axis of pivotal coupling, the axis of pivotal coupling extending through the door, the chassis enclosure configured to enclose the modular electronic device;
   wherein the door is configured to rotate between a closed position and an open position, wherein in the closed position the door covers the chassis enclosure to prevent the modular electronic device from being removed from the chassis, and wherein in the open position the door allows removal of the modular electronic device from the chassis;
   a sliding element in slidable engagement with the door, the sliding element configured to move along the door;
   wherein the apparatus includes a locking member configured to secure an engaged position with the chassis;
   at least one guide rail disposed in the chassis enclosure to guide the modular electronic device, the at least one guide rail extending from about an opening of the chassis enclosure to a rear of the chassis enclosure;
   an ejection actuator disposed in a rear of the chassis enclosure, the ejection actuator including a spring member, wherein the spring member has a first spring member end and a second spring member end, the first spring member end being connected to the ejection actuator and the second spring member end being connected to the rear of the chassis;
   wherein the spring member is configured to restore the ejection actuator to an initial position in the chassis enclosure;
   wherein the ejection actuator includes an angle bracket;
   wherein the ejection actuator is configured to move along the at least one guide rail and remove the modular electronic device from the chassis; and
   a flexible linkage element having a first linkage element end and a second linkage element end, the flexible linkage element being connected, by the first linkage element end, to the sliding element and connected, by the second linkage element end, to the ejection actuator, wherein the flexible linkage element passes around the axis of pivotal coupling of the door to the chassis.

* * * * *